United States Patent
Huang et al.

(10) Patent No.: US 10,290,610 B2
(45) Date of Patent: May 14, 2019

(54) POP DEVICE AND METHOD OF FORMING THE SAME

(71) Applicant: Taiwan Semiconductor Manufacturing Co., Ltd., Hsinchu (TW)

(72) Inventors: Li-Hsien Huang, Hsinchu County (TW); An-Jhih Su, Taoyuan (TW); Der-Chyang Yeh, Hsin-Chu (TW); Hua-Wei Tseng, New Taipei (TW); Li-Hui Cheng, New Taipei (TW); Po-Hao Tsai, Taoyuan County (TW); Wei-Yu Chen, New Taipei (TW); Ming-Shih Yeh, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 31 days.

(21) Appl. No.: 15/688,893

(22) Filed: Aug. 29, 2017

(65) Prior Publication Data
US 2019/0067249 A1 Feb. 28, 2019

(51) Int. Cl.
| H01L 23/48 | (2006.01) |
| H01L 23/52 | (2006.01) |
| H01L 29/40 | (2006.01) |
| H01L 25/065 | (2006.01) |
| H01L 21/56 | (2006.01) |
| H01L 23/31 | (2006.01) |
| H01L 21/768 | (2006.01) |
| H01L 25/00 | (2006.01) |

(Continued)

(52) U.S. Cl.
CPC ........ *H01L 25/0657* (2013.01); *H01L 21/563* (2013.01); *H01L 21/76843* (2013.01); *H01L 21/76873* (2013.01); *H01L 23/3107* (2013.01); *H01L 23/5226* (2013.01); *H01L 25/50* (2013.01); *H01L 23/49816* (2013.01); *H01L 2225/0652* (2013.01); *H01L 2225/06517* (2013.01); *H01L 2225/06548* (2013.01)

(58) Field of Classification Search
USPC ....... 257/774, 100, 433, 434, 667, 685, 686, 257/723, 726, E25.031–E25.032, 257/E23.042, 737, 738, 99; 438/67, 107, 438/109, 409, 455–459, 108, 125, 124, 438/126, 127, 613, 6, 28, 66
See application file for complete search history.

(56) References Cited

U.S. PATENT DOCUMENTS

| 8,802,504 B1 | 8/2014 | Hou et al. |
| 8,803,292 B2 | 8/2014 | Chen et al. |
| 8,803,316 B2 | 8/2014 | Lin et al. |

(Continued)

*Primary Examiner* — Niki H Nguyen
(74) *Attorney, Agent, or Firm* — JCIPRNET (57) ABSTRACT

A PoP device includes a first package structure, a second package structure and an underfill layer is provided. The first package structure includes a die, a TIV and an encapsulant. The TIV is aside the die. The encapsulant encapsulates sidewalls of the die and a portion of sidewalls of the TIV. The second package structure is connected to the first package structure through a connector. The underfill layer is disposed to fill a space between the first package structure and the second package structure. A portion of the underfill layer is disposed between the encapsulant and the TIV to cover a portion of sidewalls of the TIV.

20 Claims, 11 Drawing Sheets

(51) Int. Cl.
*H01L 23/522* (2006.01)
*H01L 23/498* (2006.01)

(56) References Cited

U.S. PATENT DOCUMENTS

| | | |
|---|---|---|
| 8,993,380 B2 | 3/2015 | Hou et al. |
| 9,048,222 B2 * | 6/2015 | Hung .................... H01L 23/481 |
| 9,281,254 B2 | 3/2016 | Yu et al. |
| 9,299,649 B2 | 3/2016 | Chiu et al. |
| 9,372,206 B2 | 6/2016 | Wu et al. |
| 9,425,126 B2 | 8/2016 | Kuo et al. |
| 9,443,783 B2 | 9/2016 | Lin et al. |
| 9,496,189 B2 | 11/2016 | Yu et al. |
| 2014/0210101 A1 * | 7/2014 | Lin ........................ H01L 24/19 |
| | | 257/774 |

* cited by examiner

POP DEVICE AND METHOD OF FORMING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

Currently, integrated fan-out packages are becoming increasingly popular for their compactness.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIGS. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1H are schematic cross-sectional views illustrating a method of forming a PoP device according to some embodiments of the disclosure.

Figure 1A:
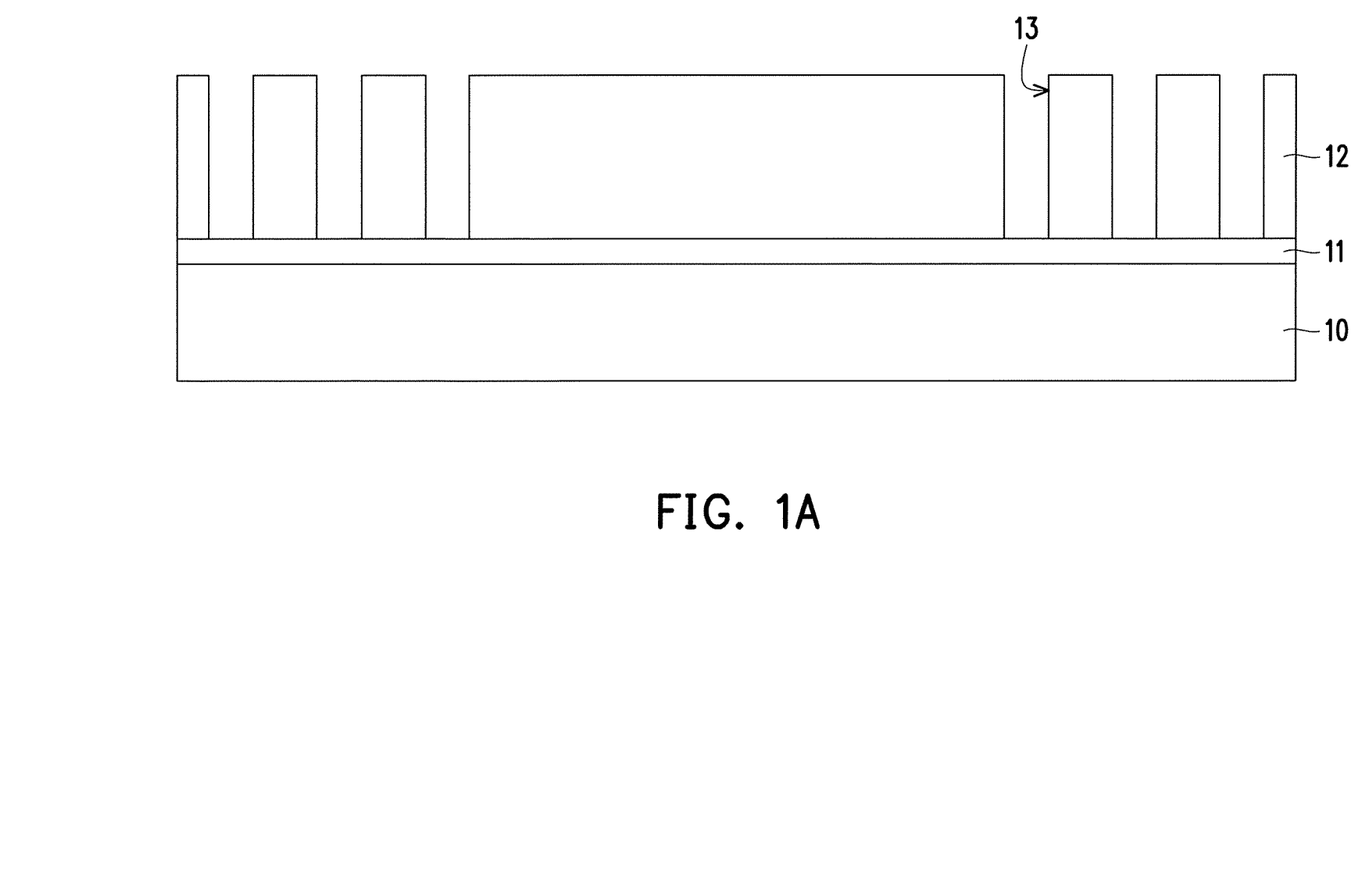
FIG. 1A to FIG. 1H are schematic cross-sectional views illustrating a method of forming a PoP device according to some embodiments of the disclosure.

Referring to FIG. 1A, a carrier 10 is provided. The carrier 10 may be a glass carrier, a ceramic carrier, or the like. A de-bonding layer 11 is formed on the carrier 10 by, for example, a spin coating method. In some embodiments, the de-bonding layer 11 may be formed of an adhesive such as an Ultra-Violet (UV) glue, a Light-to-Heat Conversion (LTHC) glue, or the like, or other types of adhesives. The de-bonding layer 11 is decomposable under the heat of light to thereby release the carrier 10 from the overlying structures that will be formed in subsequent steps.

Figure 1B:
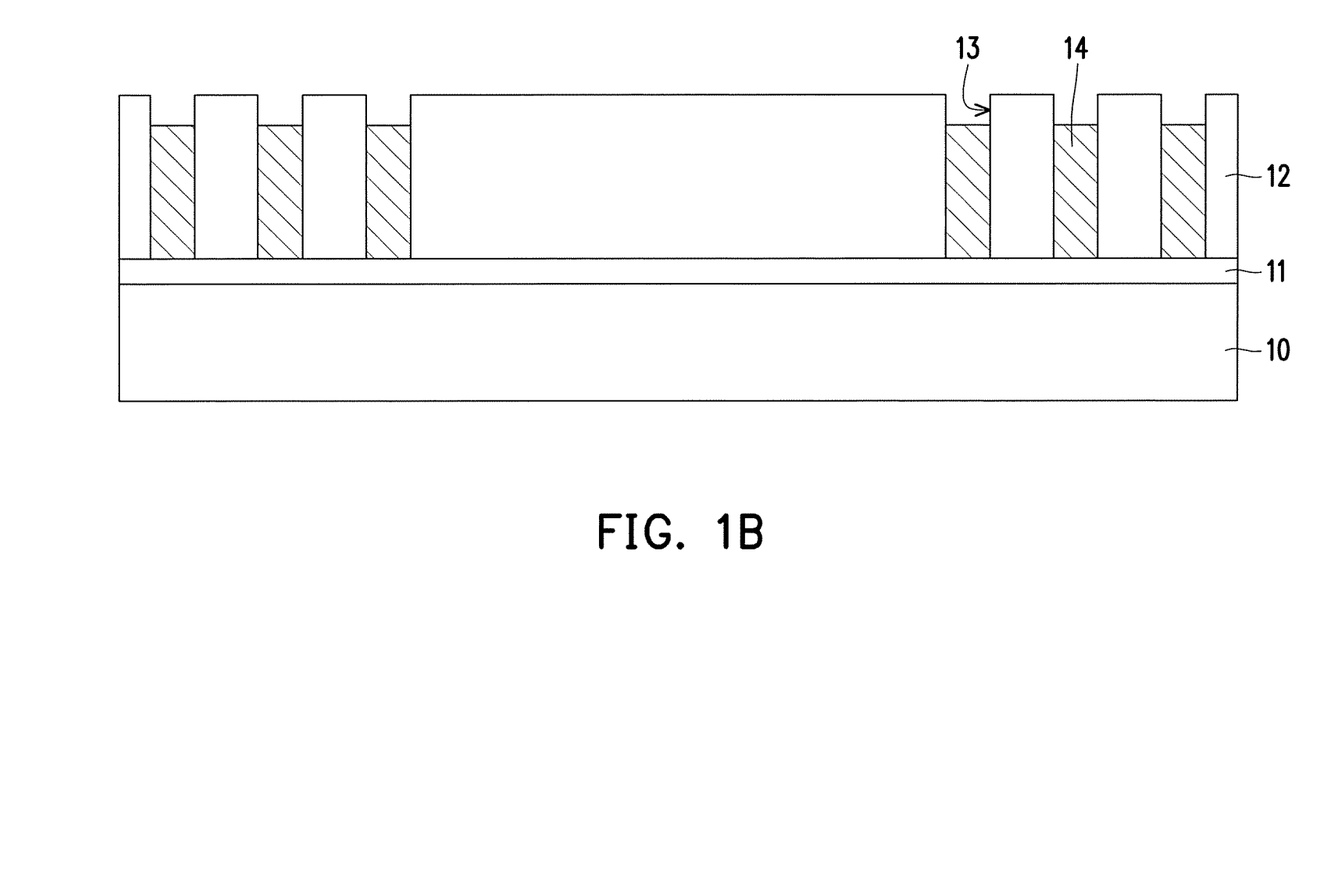

Referring to FIG. 1A and FIG. 1B, a patterned mask layer 12 is formed on the de-bonding layer 11. In some embodiments, the patterned mask layer 12 is a photoresist such as a dry film resist (DFR), for example, and has a plurality of openings 13 that exposes the intended locations for a plurality of subsequently formed through integrated fan-out vias (TIVs) 14.

Figure 1C:
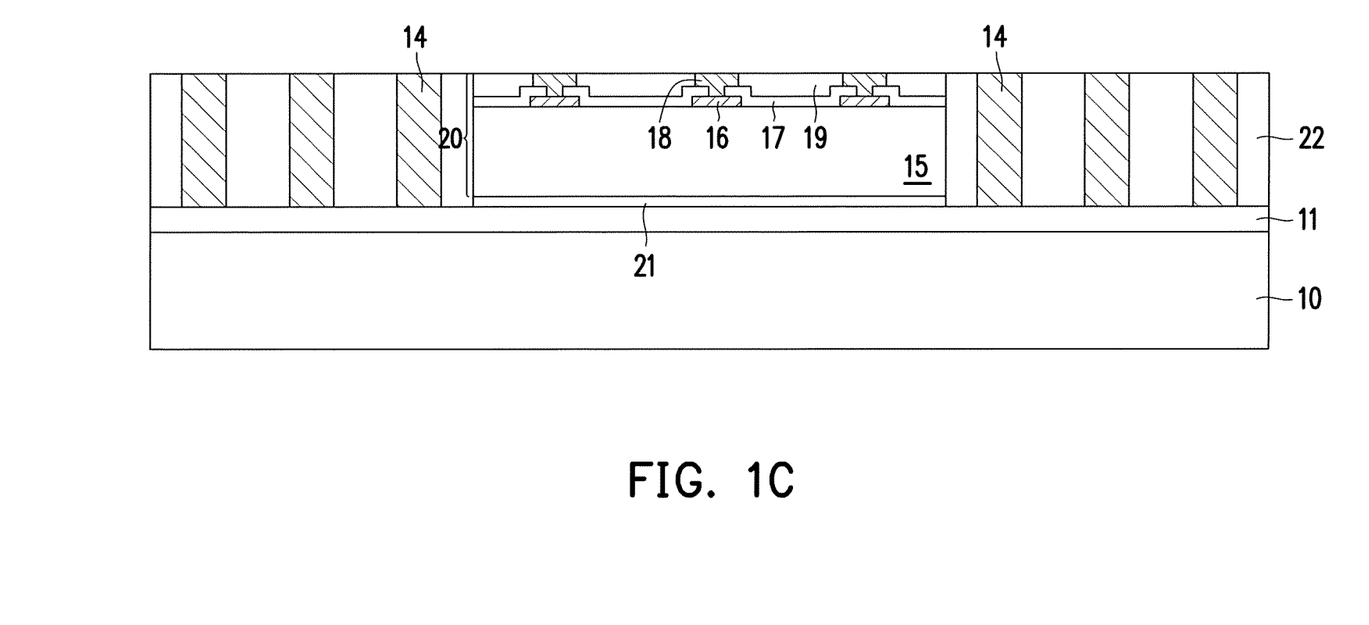

Referring to FIG. 1B and FIG. 1C, a plurality of TIVs 14 are formed in the openings 13 of the patterned mask layer 12 by an electroplating process, for example. In some embodiments, the TIV 14 includes a seed layer and a conductive layer formed on the seed layer. The seed layer is, for example, a titanium or/and copper composited layer, and is formed by a sputtering or a suitable technique. The seed layer is formed before the patterned mask 12 is formed and covers the top surface of the de-bonding layer 11. The conductive layer (e.g., a copper layer) is formed on the seed layer exposed by the openings 13. Thereafter, the patterned mask layer 12 and the seed layer not covered by the conductive layer are removed. The conductive layer and the underlying seed layer form the TIV 14. In some embodiments, the sidewalls of the TIV 14 may be straight or inclined.

Referring to FIG. 1C, a die 20 is attached to the de-bonding layer 11 over the carrier 10 through an adhesive layer 21 such as a die attach film (DAF), silver paste, or the like. In some embodiments, the die 20 is one of a plurality of dies cut apart from a wafer, for example. The die 20 may be an application-specific integrated circuit (ASIC) chip, an analog chip, a sensor chip, a wireless and radio frequency chip, a voltage regulator chip or a memory chips. The number of the die 20 shown in FIG. 1C is merely for illustration, and the disclosure is not limited thereto. In some embodiments, two or more dies 20 may be mounted over the carrier 10, and the two or more dies 20 may be the same types of dies or the different types of dies.

Still referring to FIG. 1C, the die 20 is disposed between the TIVs 14, that is, the TIVs 14 are aside or around the die 20. In some embodiments, the die 20 includes a substrate 15, a plurality of pads 16, a passivation layer 17, a plurality of connectors 18 and a passivation layer 19. The pads 16 may be a part of an interconnection structure (not shown) and electrically connected to the integrated circuit devices (not shown) formed on the substrate 15. The passivation layer 17 is formed over the substrate 15 and covers a portion of the pads 16. A portion of the pads 16 is exposed by the passivation layer 17 and serves as an external connection of the die 20. The connectors 18 are formed on and electrically connected to the pads 16 not covered by the passivation layer 17. The connector 18 includes solder bumps, gold bumps, copper bumps, copper posts, copper pillars, or the like. The passivation layer 19 is formed over the passivation layer 17 and aside the connectors 18 to cover the sidewalls of the connectors 18. The passivation layers 17 and 19 respectively include an insulating material such as silicon oxide, silicon nitride, polymer, or a combination thereof. The materials of the passivation 17 and the passivation layer 19 may be the same or different. In some embodiments, the top surface of the passivation layer 19 is substantially level with the top surface of the connectors 18.

An encapsulant 22 is then formed over the carrier 10 to encapsulate the sidewalls of the die 20 and the TIVs 14. In some embodiments, the encapsulant 22 includes a molding compound, a molding underfill, a resin such as epoxy, a combination thereof, or the like. In some other embodiments, the encapsulant 22 includes a photo-sensitive material such as polybenzoxazole (PBO), polyimide, benzocyclobutene (BCB), a combination thereof, or the like, which may be easily patterned by exposure and development processes or laser drilling process. In alternative embodiments, the encapsulant 22 includes nitride such as silicon nitride, oxide such as silicon oxide, phosphosilicate glass (PSG), borosilicate glass (BSG), boron-doped phosphosilicate glass (BPSG), a combination thereof, or the like. The encapsulant 22 is formed by forming an encapsulant material layer over the carrier 10 by a suitable fabrication technique such as spin-coating, lamination, deposition, or similar processes. The encapsulant material layer encapsulates the top surfaces and sidewalls of the die 20 and the TIVs 14. Thereafter, a grinding or polishing process is performed to remove a portion of the encapsulant material layer, such that the top surfaces of the connectors 20 and the TIVs 14 are exposed. In some embodiments, the top surfaces of the connectors 20, the TIVs 14 and the encapsulant 22 are substantially coplanar.

Figure 1D:
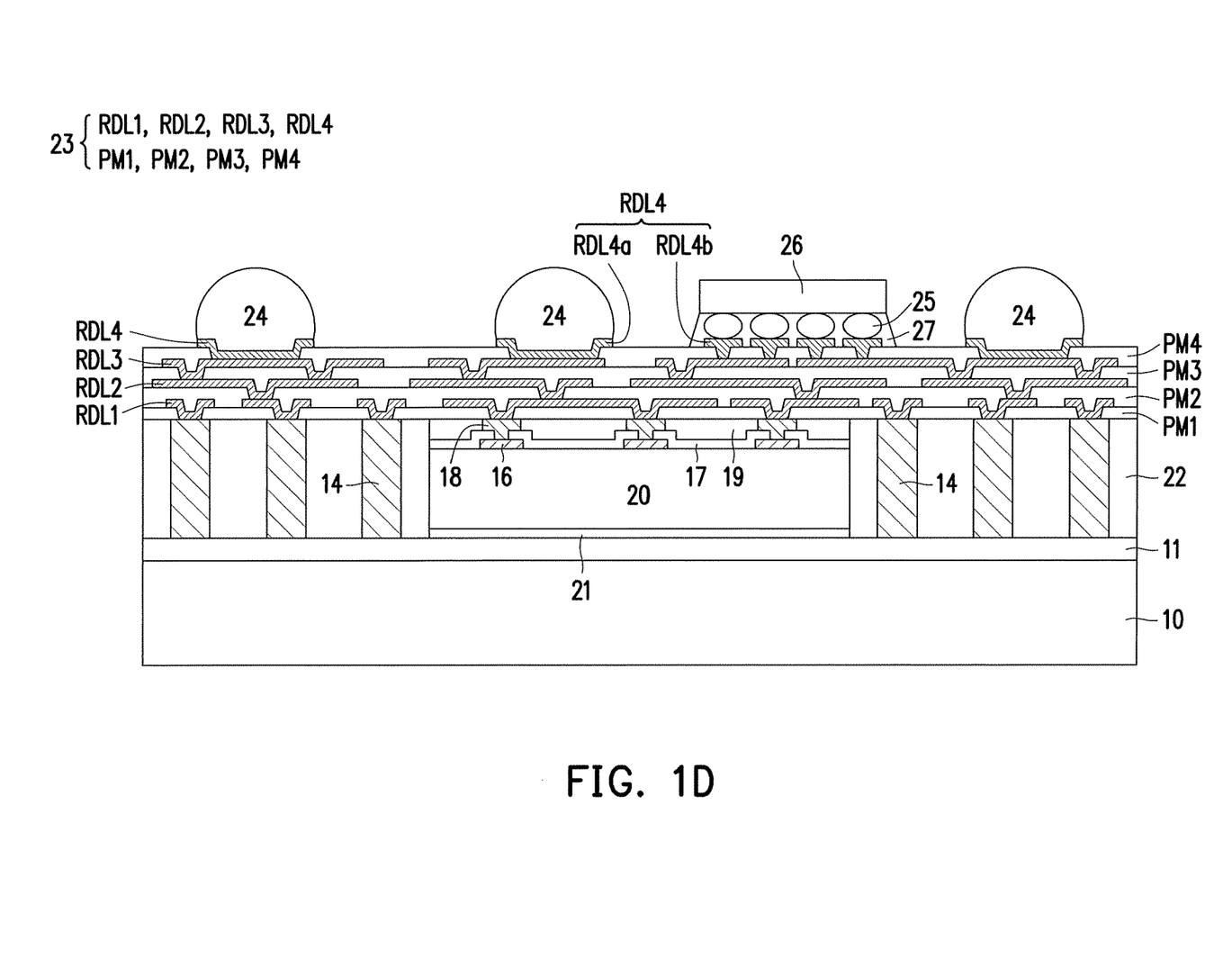

Referring to FIG. 1D, a redistribution layer (RDL) structure 23 is formed over and electrically connected to the die 20 and the TIVs 14. The RDL structure 23 is referred to as a "front-side redistribution layer structure" through the specification, wherein the "front-side" refers to a side close to the connectors 18 of the die 20. In some embodiments, the RDL structure 23 includes a plurality of polymer layers PM1, PM2, PM3 and PM4 and a plurality of redistribution layers RDL1, RDL2, RDL3 and RDL4 stacked alternately. The number of the polymer layers or the redistribution layers is not limited by the disclosure.

In other words, the redistribution layer RDL1 penetrates through the polymer layer PM1 and is electrically connected to the connectors 18 of the die 20 and the TIVs 14. The redistribution layer RDL2 penetrates through the polymer layer PM2 and is electrically connected to the redistribution layer RDL1. The redistribution layer RDL3 penetrates through the polymer layer PM3 and is electrically connected to the redistribution layer RDL2. The redistribution layer RDL4 penetrates through the polymer layer PM4 and is electrically connected to the redistribution layer RDL3. In some embodiments, each of the polymer layers PM1, PM2, PM3 and PM4 includes a photo-sensitive material such as polybenzoxazole (PBO), polyimide (PI), benzocyclobutene (BCB), a combination thereof or the like. In some embodiments, each of the redistribution layers RDL1, RDL2, RDL3 and RDL4 includes conductive materials. The conductive materials includes metal such as copper, nickel, titanium, a combination thereof or the like, and is formed by an electroplating process. In some embodiments, the redistribution layers RDL1, RDL2, RDL3 and RDL4 respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals. In some embodiments, the redistribution layers RDL1, RDL1, RDL3 and RDL 4 respectively includes a plurality of vias and a plurality of traces connected to each other. The vias connects the redistribution layers RDL1, RDL1, RDL3 and RDL 4, and the traces are respectively located on the polymer layers PM1, PM2, PM3 and PM 4, and are respectively extending on the top surface of the polymer layers PM1, PM2, PM3 and PM4.

In some embodiments, the topmost redistribution layer RDL4 includes RDL4a and RDL4b. The redistribution layer RDL4a is also referred as under-ball metallurgy (UBM) layer for ball mounting. The redistribution layer RDL4b may be micro bump for connecting to an integrated passive device (IPD) 26 formed in the subsequent process.

Thereafter, a plurality of connectors 24 are formed over and electrically connected to the redistribution layer RDL4a of the redistribution layer structure 23. In some embodiments, the connectors 24 are made of a conductive material with low resistivity, such as Sn, Pb, Ag, Cu, Ni, Bi or an alloy thereof, and are formed by a suitable process such as evaporation, plating, ball drop, or screen printing. An IPD 26 is formed over and electrically connected to the redistribution layer RDL4b of the redistribution layer structure 23 through the solder bumps 25. The IPD 26 may be a capacitor, a resistor, an inductor or the like, or a combination thereof. The number of the IPD 26 is not limited to that is shown in FIG. 1D, but may be adjusted according to the design of the product. An underfill layer 27 is formed between the IPD 26 and the polymer layer PM4, and surrounds and covers the exposed RDL4b, the solder bumps 25 and the bottom surface of the IPD 26.

Figure 1E:
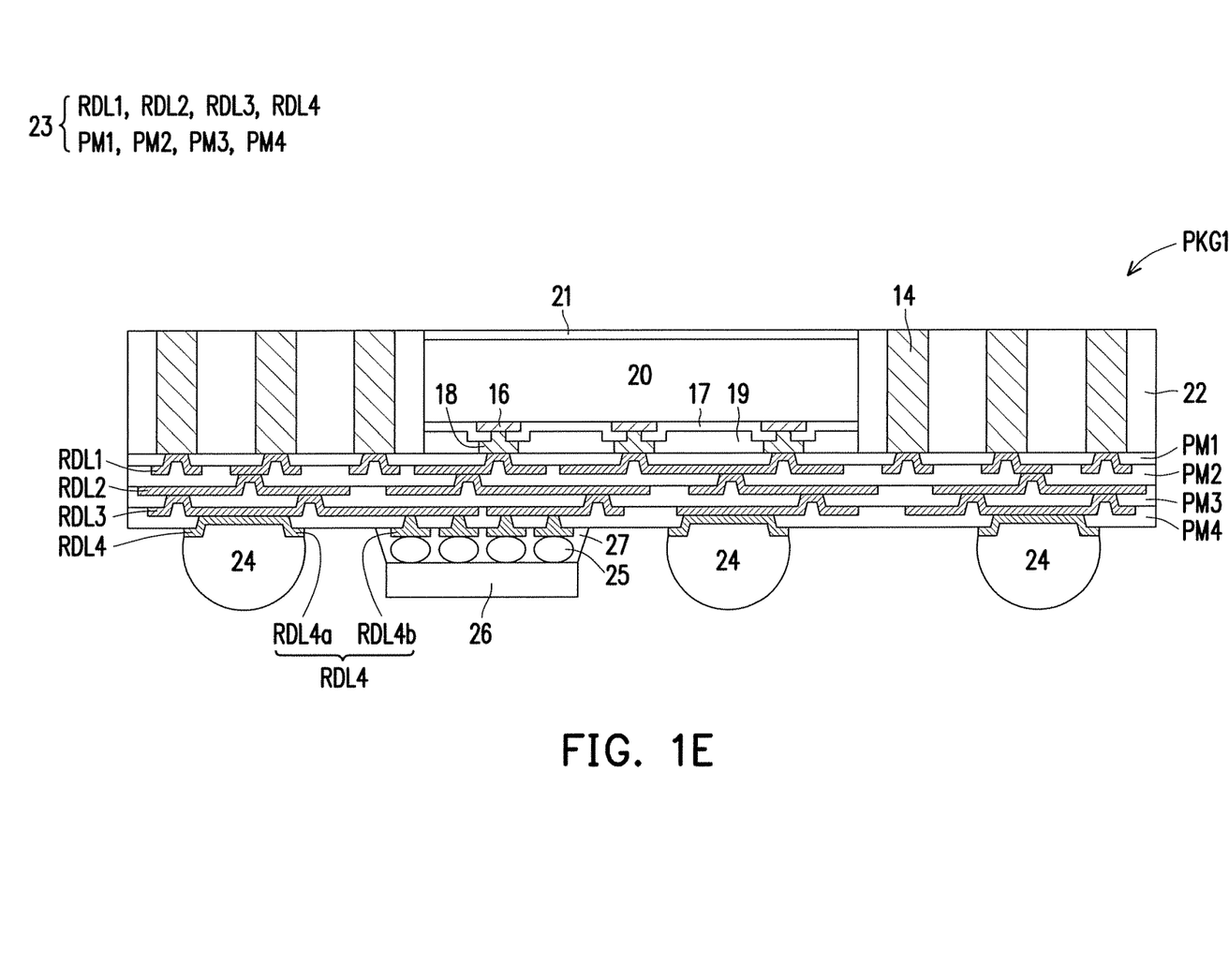

Referring to FIG. 1D and FIG. 1E, the carrier 10 is de-bonded from the backside of the first package structure PKG1. In some embodiments, the structure formed in FIG. 1D is turned over, the de-bonding layer 11 is decomposed under the heat of light, and the carrier 10 is then released, and the first package structure PKG1 is thus completed.

Still referring to FIG. 1E, the first package structure PKG1 includes the die 20, the adhesive layer 21, the TIVs 14, the encapsulant 22, the RDL structure 23, the connectors 24 and the IPD 26. After the carrier 10 is released, the top surface of the adhesive layer 21, the top surface of the TIVs 14 and the top surface of the encapsulant 22 are exposed and substantially coplanar.

Figure 1F:
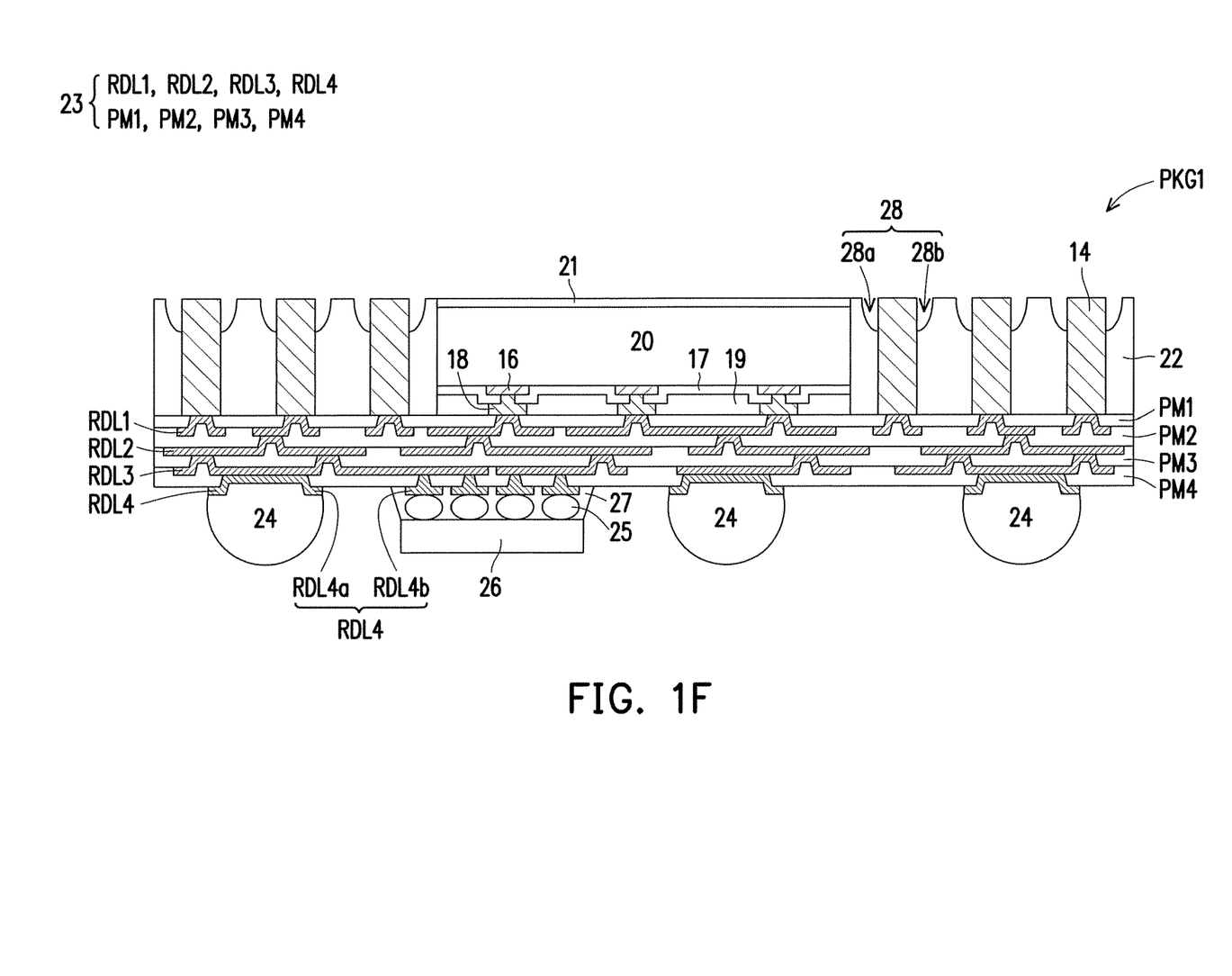

Referring to FIG. 1F, portions of the encapsulant 22 covering the sidewalls of the TIVs 14 are removed to form a plurality of recesses 28 between the TIVs 14 and the encapsulant 22. The removal method is, for example, laser drilling process. The recesses 28 expose an upper portion of the sidewalls of the TIVs 14. In the cross-section view shown in FIG. 1F, the TIV 14 is located between two recesses 28, such that both the two sidewalls of the TIV 14 have a portion exposed in the recess 28. Actually, in the top view of FIG. 1F, the TIV 14 is surround by the recess 28, that is to say, the recess 28 is around the TIV 14, such that an upper portion of the sidewalls of the TIV is exposed.

Figure 2A:
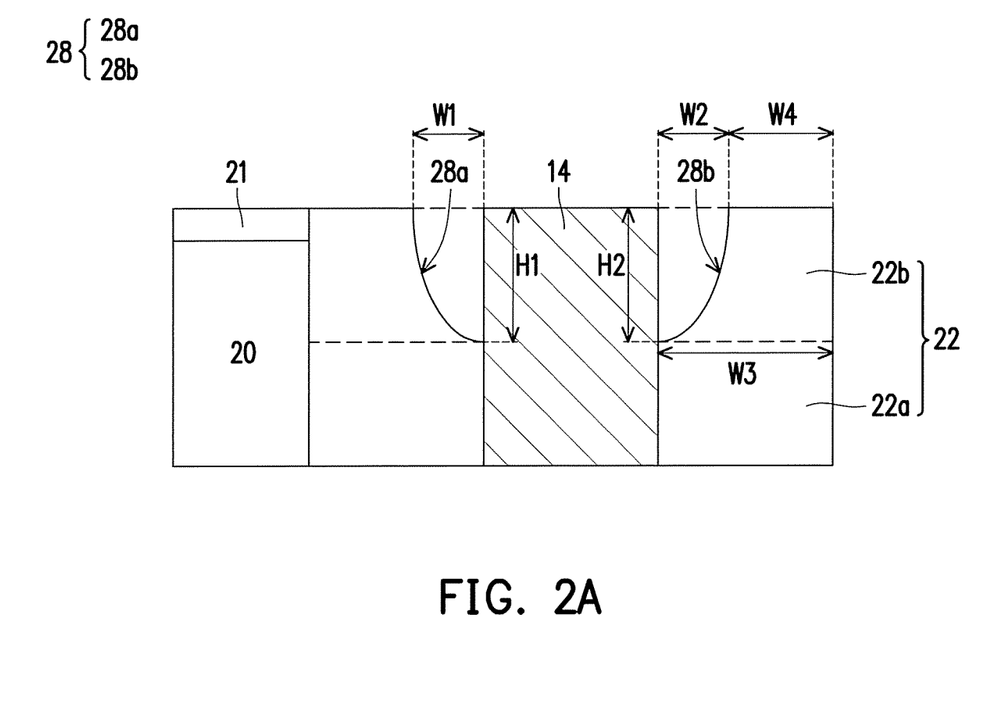
FIG. 2A is an enlarged view of a portion of the structure in FIG. 1F according to some embodiments of the disclosure.

FIG. 2A is an enlarged view of a portion of the structure in FIG. 1F according to some embodiments of the disclosure.

Referring to FIG. 2A, the recess 28 includes a first recess 28a and a second recess 28b disposed at the two opposite sides of the TIV 14. In some embodiments, the cross-section shapes of the first recess 28a and the second recess 28b are intercepted arc or sector, that is, a sidewall (the sidewall exposing the TIV 14) of the recess 28a or 28b is straight or inclined and another sidewall (a sidewall of the encapsulant 22) of the recess 28a or 28b is arc shaped. In some other embodiments, the cross-section shapes of the first recess 28a and the second recess 28b are triangle-like shaped. The width of the first recess 28a and the second recess 28b are gradually decreased from top to bottom, but the disclosure is not limited thereto. The cross-section shapes of the first recess 28a and the second recess 28b may respectively be any shape, as long as the first recess 28a and the second recess 28b respectively exposes a portion of the sidewall of the TIV 14.

The depth H1 of the first recess 28a and the depth H2 of the second recess 28b, that is, the height of the exposed sidewalls of the TIV 14 range from 10 μm to 50 μm, respectively. In some embodiments, the top width W1 of the first recess 28a and the top width W2 of the second recess 28b are larger than or equal to 10 μm, respectively. In some other embodiments, the top width W1 and the top width W2 range from 5 μm to 50 μm, respectively. In some embodiments, the first recess 28a and the second recess 28b have a same shape and a same size, and are symmetrically arranged, that is, the top width W1 and the depth H1 of the first recess 28a are substantially equal to the top width W2 and the depth H2 of the second recess 28b, respectively. In some other embodiments, the first recess 28a and the second recess 28b have different shapes or sizes, and are not symmetrically arranged, that is, the top width W1 and the depth H1 of the first recess 28a are different form the top width W2 and the depth H2 of the second recess 28b, respectively.

In other words, the encapsulant 22 includes a first part 22a and a second part 22b. The first part 22a is underlying the second part 22b and contacts with the sidewalls of the TIV 14 to encapsulate the bottom portion of the sidewalls of the TIV 14. The second part 22b is connected to the first part 22a and separated from the TIV 14 by the recess 28. In some embodiments, the cross-section shape of the first part 22a is square or rectangle, the cross-section shape of the second part 22b is trapezoid or a trapezoid with an arced leg, and the bottom surface of the second part 22b is the top surface of the first part 22a. In other words, the bottom width W3 of the second part 22b substantially equals to the width W3 of the first part 22a. The top width W4 of the second part 22b is less than the bottom width W3 of the second part 22b, and the width difference (W3−W4) thereof substantially equals to the top width W1 of the first recess 28a or the top width W2 of the second recess 28b.

Figure 1G:
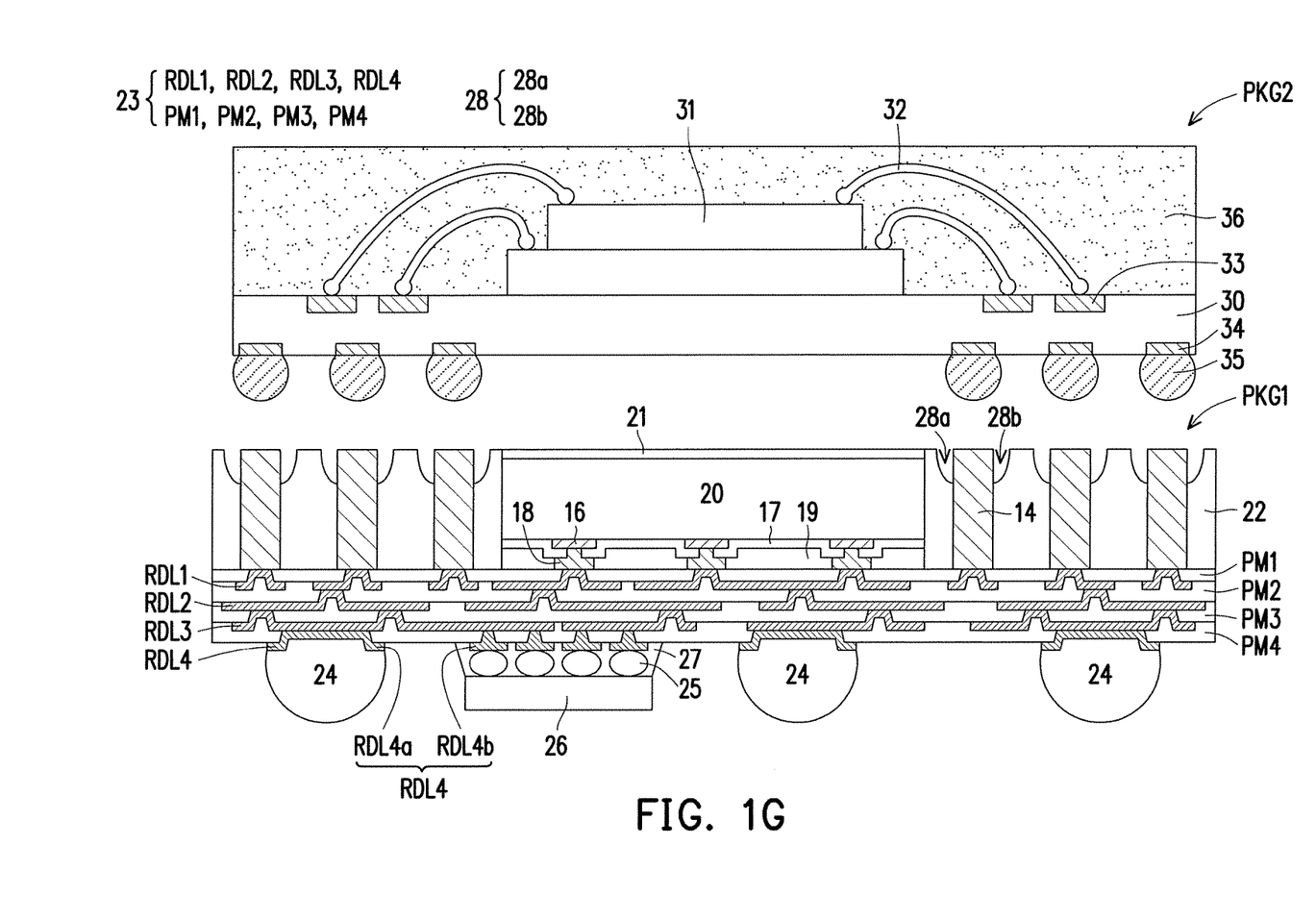

Referring to FIG. 1G, a second package structure PKG2 is provided. In some embodiments, the second package structure PKG2 includes a substrate 30, and a die 31 is mounted on one surface (e.g. top surface) of the substrate 30. Bonding wires 32 are used to provide electrical connections between the die 31 and pads 33 (such as bonding pads) on the same top surface of the substrate 30. TIVs (not shown) may be used to provide electrical connections between the pads 33 and the pads 34 (such as bonding pads) on an opposing surface (e.g. bottom surface) of the substrate 30. A plurality of connectors 35 are formed to connect to the pads 34. The connectors 35 are metal bumps such as solder bumps. In some embodiments, the connectors 35 may be referred as conductive terminals. An encapsulant 36 is formed over the components to protect the components from the environment and external contaminants.

Figure 1H:
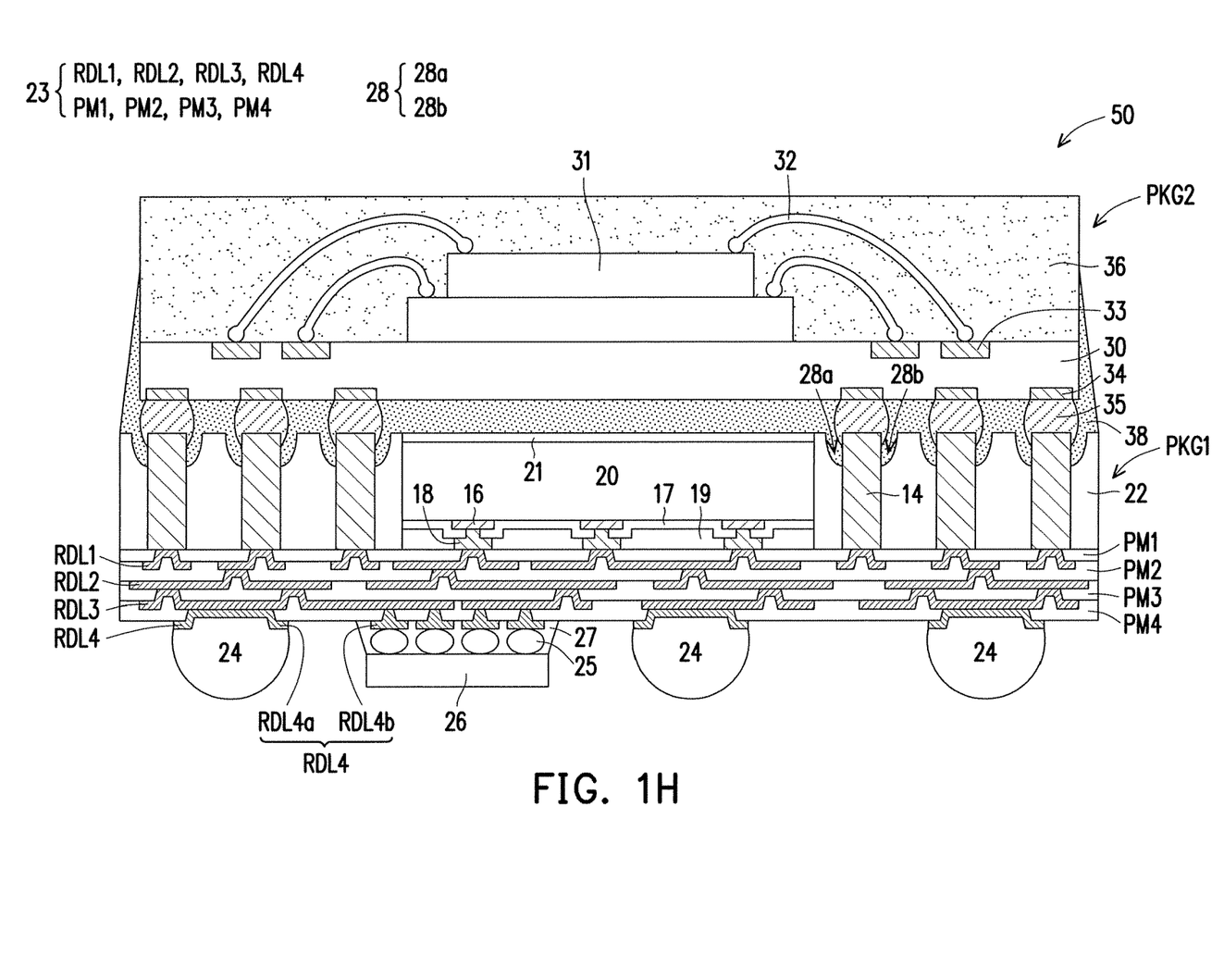
Figure 2B:
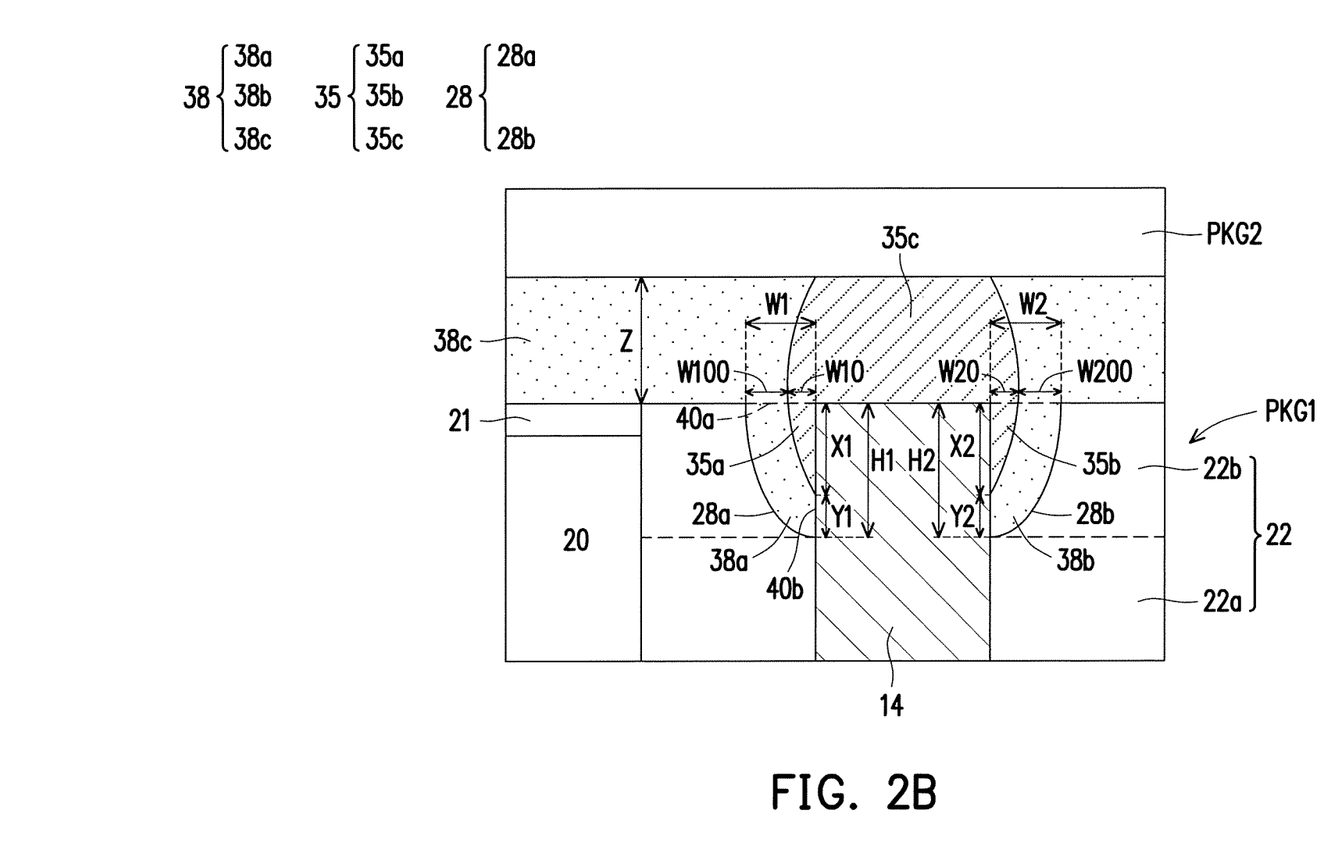
FIG. 2B and FIG. 2C are enlarged views of a portion of the structure in FIG. 1H according to some embodiments of the disclosure.

Referring to FIG. 1H and FIG. 2B, the second package structure PKG2 is then bonded to the first package structure PKG1 through the connectors 35, so as to form a PoP device 50. In this embodiment, the connector 35 is formed on the second package structure PKG2 to connect to the first package structure PKG1. In some other embodiments, the connector 35 may be formed on the first package structure PKG1 to connect to the second package structure PKG2. In some embodiments, a reflow process is performed when bonding the second package structure PKG2 to the first package structure PKG1. In some embodiments, the connector 35 is referred as a PoP ball. The connector 35 is aligned with and electrically connected to the TIV 14 and covers the top surface of the TIV 14. In some embodiments, during the reflow process, the connector 35 further extends into the recess 28 to cover a portion of the sidewalls of the TIV 14 exposed in the recess 28. It is mentioned that the depths H1 and H2 of the recess 28 are larger than the length X1 and X2 of the connector 35 extending into the recess. That is to say, the recess 28 is partially filled with the connector 35. In some other embodiments, the connector 35 does not extend into the recesses 28.

In some embodiments, the connector 35 is like a cap on the TIV 14 to cover the top surface and a portion of sidewalls of the TIV 14, and the cross-section shape of the portion of the connector 35 in the recess 28 is tooth-shaped. The connector 35 includes a body part 35c, a first tooth part 35a and a second tooth part 35b. The body part 35c is located on the TIV 14 and covers the top surface of the TIV 14. The first tooth part 35a and the second tooth part 35b are located in the recess 28 to surround a portion of the TIV 14 and at the ends of the body part 35c to respectively connect to the body part 35c. In some embodiments, the width of the bottom surface of the body part 35c is larger than the top width of the TIV 14 because of the existence of the first tooth part 35a and the second tooth part 35b. The first tooth part 35a is located in the first recess 28a and covers a portion of the sidewall of the TIV 14 exposed in the first recess 28a. The second part 35b is located in the second recess 28b and covers a portion of the sidewall of the TIV 14 exposed in the second recess 28b.

Still referring to FIG. 1H and FIG. 2B, thereafter, an underfill layer 38 is formed to fill the space between the first package structure PKG1 and the second package structure PKG2 and fills into the recesses 28, so as to surround the connectors 35 and a portion of the TIVs 14. The underfill layer 38 includes a plurality of particles, and the particle size of the particle is less than the width difference (W1−W10/W2−W20) between the top width W1/W2 of the recess 28 and the top width W10/W20 of the tooth part 35a/35b of the connector 35 (FIG. 2B) and ranges from 0.5 μm to 10 μm, for example. The underfill layer 38 is in contact with the adhesive layer 21, the encapsulant 22, the connector 35 and the TIV 14. The underfill layer 38 includes a body part 38c, a first extension part 38a and a second extension part 38b. The body part 38c of the underfill layer 38 is located over the die 20 and the TIVs 14, and surrounds the body part 35c of the connector 35. The thickness Z of the body part 38c ranges from 50 μm to 120 μm. The first extension part 38a and the second extension part 38b are respectively located in the recess 28 and connected to the body part 38c. Further, the first extension part 38a and the second extension part 38b are respectively located between and separate the connector 35 and the encapsulant 22.

The first extension part 38a is located in the first recess 28a and aside the first tooth part 35c of the connector 35. The first extension part 38a covers a sidewall of the first tooth part 35a of the connector 35, a portion of a sidewall of the TIV 14 and a portion of a sidewall of the encapsulant 22. In other words, the first extension part 38a is located between the encapsulant 22 and the TIV 14, and between the encapsulant 22 and the first tooth part 35a of the connector 35.

The second extension part 38b is located in the second recess 28b and aside the second tooth part 35b of the connector 35. The second extension part 38b covers a sidewall of the second tooth part 35b of the connector 35, a portion of a sidewall of the TIV 14 and a portion of a sidewall of the encapsulant 22. In other words, the second extension part 38b is located between the encapsulant 22 and the TIV 14, and between the encapsulant 22 and the second tooth part 35b of the connector 35.

Referring to FIG. 2B, the structural characteristics and the size ranges of the first tooth part 35a and the second tooth part 35b of the connector 35 are substantially similar to each other, and the first tooth part 35a and second tooth part 35b may be symmetrically disposed or not symmetrically disposed. The structural characteristics and the size ranges of the first extension part 38a and the second extension part 38b are substantially similar to each other, and the first extension part 38a and second extension part 38b may be symmetrically disposed or not symmetrically disposed. For the sake of the brevity, the first tooth part 35b of the connector 35 and the first extension part 38a of the underfill layer 38 in the first recess 28a are taken for example. The details are described as below.

The first tooth part 35a of the connector 35 is located between the first extension part 38a and the TIV 14 and separated from encapsulant 22 by the first extension part 38a therebetween. In some embodiments, the cross-section shape of the first tooth part 35a is intercepted arc, sector, or triangle, but the disclosure is not limited thereto. The top width W10 of the first tooth part 35a ranges from 0 μm to 20 μm, and the width of the first tooth part 35a is gradually decreased from top to bottom. The length X1 of the first tooth part 35a, that is, the height of the sidewall of the TIV 14 covered by the first tooth part 35a ranges from 0 μm to 20 μm.

The first extension part 38a of the underfill layer 38 is located at a side of the first tooth part 35a of the connector 35, and extends from the top to the bottom of the first recess 28a. In some embodiments, the first extension part 38a has a curved tube-shaped cross-section shape and has two ends 40a and 40b. The end 40a of the first extension part 38a contacts with the body part 38c. The end 40b of the first extension part 38a contacts with and covers a portion of the sidewall of the TIV 14. The two sidewalls of the first extension part 38a are respectively contacted with the first tooth part 35a and the encapsulant 20. The top width W100 of the first extension part 38a ranges from 5 μm to 30 μm. The length Y1 of the end 40b of the first extension part 38a, that is the height of the sidewall of the TIV 14 covered by the first extension part 38a ranges from 10 μm to 30 μm. In some embodiments, the sum value of the length X1 and the length Y1 substantially equals to the value of the depth H1 of the first recess 28a.

The ranges of the top width W20 of the second tooth part 35b, the top width W200 of the second extension part 38b, the length X2 of the second tooth part 35b and the length Y2 of an end of the second extension part 38b are substantially the same as the ranges of the top width W10, the top width W100, the length X1 and the length Y1 described above. In some embodiments in which the first tooth part 35a and the second tooth part 35b, the first extension part 38a and the second extension part 38b are symmetrically disposed, respectively, the value of the top width W10, the top width W100, the length X1 and the length Y1 are respectively the same as the top width W20, the top width W200, the length X2 and the length Y2. In some embodiments in which the first tooth part 35a and the second tooth part 35b, the first extension part 38a and the second extension part 38b are respectively not symmetrically disposed, the value of the top width W10, the top width W100, the length X1 and the length Y1 are respectively different from the top width W20, the top width W200, the length X2 and the length Y2.

Referring to FIG. 1H and FIG. 2B, in some embodiments of the disclosure, the recesses 28 are filled with the underfill layer 38 and the connector 35. In other words, the top surface of the TIV 14 is covered by the connector 35, and the sidewalls of the TIV 14 exposed in the recess 28 (that is, the sidewalls of the upper portion of the TIV 14) are covered by the connector 35 and the underfill layer 38, the sidewalls of the TIV 14 underlying the recesses 28 are covered by the first part 22a of the encapsulant 22. In some embodiments, the top surface of the TIV 14, the top surface of the first tooth part 35a and the second tooth part 35b of the connector 35, the top surface of the first extension part 38a and the second extension part 38b of the underfill layer 38, the top surface of the encapsulant 22 and the top surface of the adhesive layer 21 are substantially coplanar with each other. Further, the top surface of the TIV 14 and the top surface of the encapsulant 22 are separated by the connector 35 and the underfill layer 38 therebetween. In other words, the second part 22b of the encapsulant 22 and the TIV 14 are separated by the connector 35 and the underfill layer 38 therebetween.

Figure 2C:
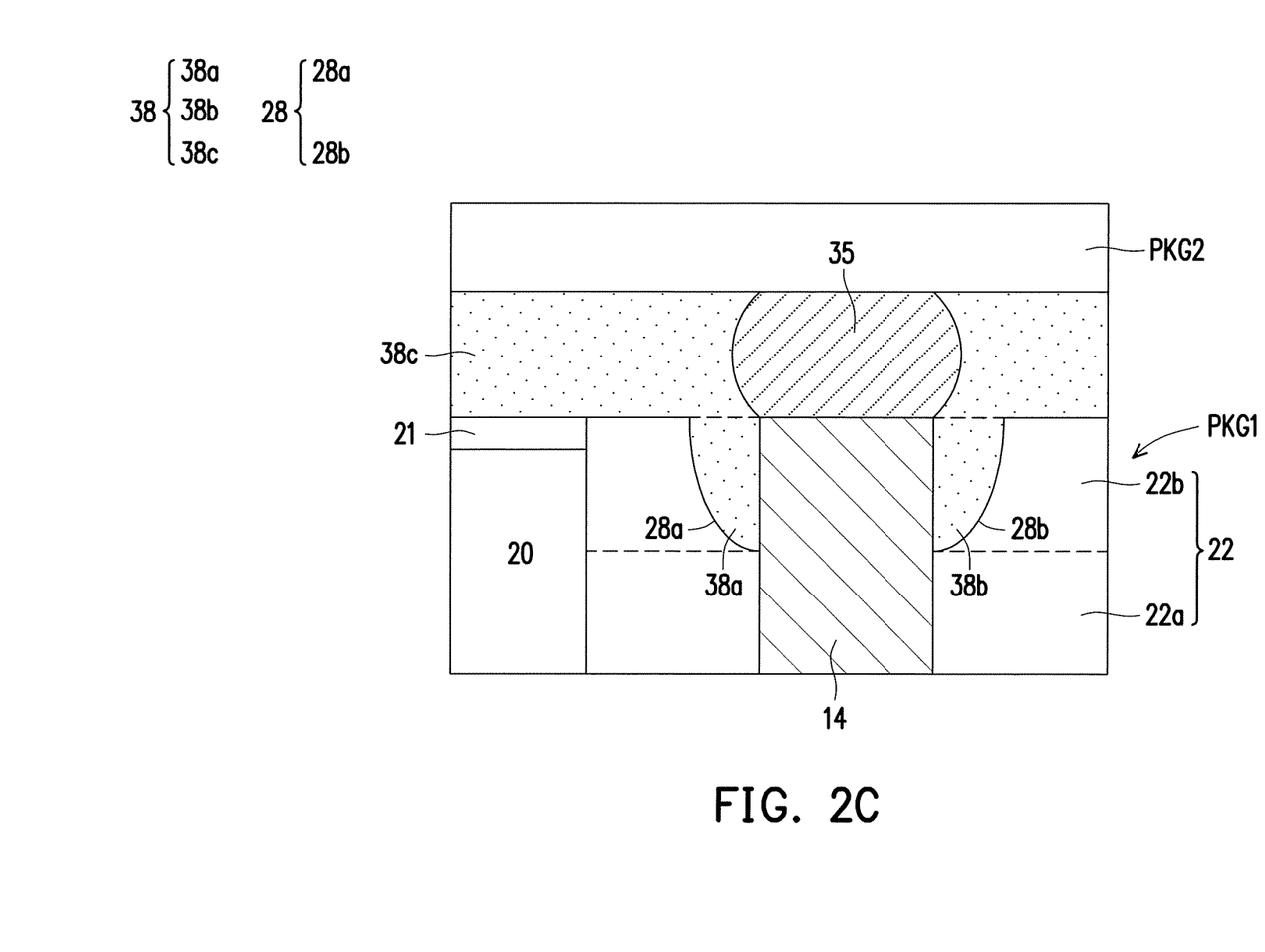

Referring to FIG. 2C, In some other embodiments, the connector 35 is disposed on the TIV 14 and does not fill into the recess 28, and the recess 28 is filled with the underfill layer 38, such that the top surface of the TIV 14 is covered by the connector 35 and the sidewalls of the TIV 14 exposed in the recess 28 are covered by the underfill layer 38. That is to say, the sidewalls of the TIV 14 are covered by the encapsulant 22 and the underfill layer 38. The top surface of the TIV 14 are substantially coplanar with the top surface of the encapsulant 22 and the adhesive layer 21, and the top surface of the TIV 14 and the top surface of the encapsulant 22 are separated by the underfill layer 38 therebetween. In other words, the second part 22b of the encapsulant 22 and the TIV 14 are separated by the underfill layer 38 therebetween.

In some embodiments of the disclosure, a plurality of recesses are formed around the TIVs, and the depth of the recess is larger than the length of the connector extending into the recess (that is the length of the connector delamination), thus the problem may be caused by delamination of the connector is avoided, and no additional dielectric material is needed to be formed between the die, the TIV and the de-bonding layer on the carrier before the TIV is formed, thus the cycle time is enhanced and the cost is reduced during the production.

In accordance with some embodiments of the disclosure, a PoP device includes a first package structure, a second package structure and an underfill layer is provided. The first package structure includes a die, a TIV and an encapsulant. The TIV is aside the die. The encapsulant encapsulates sidewalls of the die and a portion of sidewalls of the TIV. The second package structure is connected to the first package structure through a connector. The underfill layer is disposed to fill a space between the first package structure and the second package structure. A portion of the underfill layer is disposed between the encapsulant and the TIV to cover a portion of sidewalls of the TIV.

In accordance with some embodiments of the disclosure, a package structure includes a die, a TIV, an encapsulant and an underfill layer is provided. The TIV is aside the die. The encapsulant encapsulates sidewalls of the die and a portion of sidewalls of the TIV. The encapsulant has a recess disposed around the TIV. The underfill layer is disposed in the recess and between the encapsulant and the TIV to cover a portion of sidewalls of the TIV.

In accordance with some embodiments of the disclosure, a method of manufacturing a PoP device is provided. A first package structure is formed. The method of forming the first package structure is described as below. A TIV is formed aside a die with an adhesive layer. An encapsulant is formed to encapsulate sidewalls of the die and sidewalls of the TIV. A portion of the encapsulant is removed to form a recess around the TIV, such that portions of sidewalls of the TIV are exposed in the recess. A connector is formed on the TIV, so as to connect the first package structure to a second package structure. An underfill layer is formed between the first package structure and the second package structure. The underfill layer fills into the recess to cover portions of sidewalls of the TIV.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A PoP device, comprising:
   a first package structure, comprising:
      a die;
      a TIV aside the die; and
      an encapsulant encapsulating sidewalls of the die and a portion of sidewalls of the TIV,
   a second package structure, connected to the first package structure through a connector; and
   an underfill layer, disposed to fill a space between the first package structure and the second package structure,
   wherein a portion of the underfill layer is disposed between the encapsulant and the TIV to cover and to be in physical contact with a portion of sidewalls of the TIV.

2. The PoP device of claim 1, wherein the connector covers the top surface of the TIV.

3. The PoP device of claim 2, wherein the connector further covers a portion of sidewalls of the TIV.

4. The PoP device of claim 3, wherein the portion of the underfill layer is further disposed between the encapsulant and the connector.

5. The PoP device of claim 1, wherein the first package structure further comprises an adhesive layer disposed between the die and underfill layer.

6. The PoP device of claim 5, wherein a top surface of the TIV, a top surface of the encapsulant and a top surface of the adhesive layer are coplanar with each other.

7. The PoP device of claim 6, wherein the top surface of the TIV and the top surface of the encapsulant are separated by the underfill layer therebetween.

8. The PoP device of claim 6, wherein the top surface of the TIV and the top surface of the encapsulant are separated by the underfill layer and the connector therebetween.

9. A package structure, comprising:
   a die;
   a TIV aside the die; and
   an encapsulant encapsulating sidewalls of the die and a portion of sidewalls of the TIV, wherein the encapsulant has a recess disposed around the TIV;
   an underfill layer, disposed in the recess and between the encapsulant and the TIV to cover and to be in physical contact with a portion of sidewalls of the TIV.

10. The package structure of claim 9, further comprises a connector, wherein the connector connects the TIV to another package structure to form a PoP device.

11. The package structure of claim 10, wherein the connector is disposed over the TIV to cover a top surface of the TIV.

12. The package structure of claim 11, wherein the connector is further disposed in the recess to cover an upper portion of sidewalls of the TIV.

13. The package structure of claim 12, further comprises an adhesive layer on the die.

14. The package structure of claim 13, wherein the top surface of the TIV are coplanar with a top surface of the encapsulant and a top surface of the adhesive layer.

15. The package structure of claim 14, wherein the top surface of the TIV and the top surface of the encapsulant are separated by the underfill layer and the connector therebetween.

16. A method of manufacturing a PoP device, comprising:
   forming a first package structure, comprising:
      forming a TIV aside a die with an adhesive layer;
      forming an encapsulant to encapsulate sidewalls of the die and sidewalls of the TIV;
      removing a portion of the encapsulant to form a recess around the TIV, such that portions of sidewalls of the TIV are exposed in the recess;
   forming a connector on the TIV, so as to connect the first package structure to a second package structure; and
   forming an underfill layer between the first package structure and the second package structure,
   wherein the underfill layer fills into the recess to cover and to be in physical contact with portions of sidewalls of the TIV.

17. The method of claim 16, wherein before the underfill layer is formed, the connector further extends into the recess to cover portions of sidewalls of the TIV.

18. The method of claim 16, wherein a top surface of the adhesive layer, a top surface of the encapsulant and a top surface of the TIV are formed to be coplanar with each other.

19. The method of claim 18, wherein the top surface of the TIV and the top surface of the encapsulant are separated by the underfill layer formed therebetween.

20. The method of claim 18, wherein the top surface of the TIV and the top surface of the encapsulant are separated by the underfill layer and the connector formed therebetween.

* * * * *